US009966901B2

United States Patent
Apalkov et al.

(10) Patent No.: US 9,966,901 B2
(45) Date of Patent: May 8, 2018

(54) SPIN-TORQUE OSCILLATOR BASED ON EASY-CONE ANISOTROPY

(71) Applicant: Samsung Electronics Co., Ltd., Suwon-si, Gyeonggi-do (KR)

(72) Inventors: Dmytro Apalkov, San Jose, CA (US); Roman Chepulskyy, Milipitas, CA (US); Vladimir Nikitin, Campbell, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 93 days.

(21) Appl. No.: 15/067,009

(22) Filed: Mar. 10, 2016

(65) Prior Publication Data

US 2017/0149387 A1    May 25, 2017

Related U.S. Application Data

(60) Provisional application No. 62/257,684, filed on Nov. 19, 2015.

(51) Int. Cl.

| H03B 5/08 | (2006.01) |
|---|---|
| H03B 15/00 | (2006.01) |
| H01L 29/82 | (2006.01) |
| H01L 43/08 | (2006.01) |
| G11C 11/16 | (2006.01) |
| H01L 43/10 | (2006.01) |

(52) U.S. Cl.
CPC .......... *H03B 15/006* (2013.01); *G11C 11/16* (2013.01); *H01L 29/82* (2013.01); *H01L 43/08* (2013.01); *H01L 43/10* (2013.01)

(58) Field of Classification Search
CPC ......... H01L 43/08; H01L 29/82; H01L 43/10; G11C 11/16; H03B 15/006
USPC ........... 257/421; 438/3; 360/324.2; 331/94.1
See application file for complete search history.

(56) References Cited

U.S. PATENT DOCUMENTS

| 7,266,012 | B2 | 9/2007 | Saito et al. |
|---|---|---|---|
| 8,363,462 | B2 | 1/2013 | Nagase et al. |
| 8,374,048 | B2 | 2/2013 | Apalkov |
| 8,399,941 | B2 | 3/2013 | Apalkov et al. |
| 8,456,898 | B2 | 6/2013 | Chen et al. |
| 2011/0038198 | A1* | 2/2011 | Kent ............... G11C 11/16 365/158 |
| 2014/0016404 | A1 | 1/2014 | Kim et al. |

(Continued)

OTHER PUBLICATIONS

Russek, et al., 38 Spin-Transfer Nano-Oscillators, Handbook of Nanophysics: Functional Handbook Materials, pp. 38-1-38-23.

*Primary Examiner* — Arnold Kinkead
(74) *Attorney, Agent, or Firm* — Lewis Roca Rothgerber Christie LLP

(57) ABSTRACT

A spin-torque oscillator includes: a driving reference layer having a fixed magnetization; a nonmagnetic spacer layer; and a free layer having a changeable magnetization exhibiting an easy-cone magnetic anisotropy, the nonmagnetic spacer layer being between the driving reference layer and the free layer, a magnetic anisotropy energy of the free layer having a local maximum along an axis, a local minimum at an angle from the axis, and a global maximum different from the local maximum, the angle being greater than zero degrees, wherein the spin-torque oscillator is configured such that the changeable magnetization of the free layer precesses around the axis.

19 Claims, 9 Drawing Sheets

(56) References Cited

U.S. PATENT DOCUMENTS

2014/0110803 A1* 4/2014 Apalkov ................ H01L 43/02
                                                    257/421
2014/0264673 A1   9/2014 Kitagawa et al.

* cited by examiner

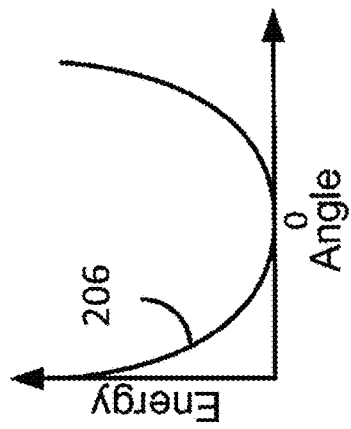
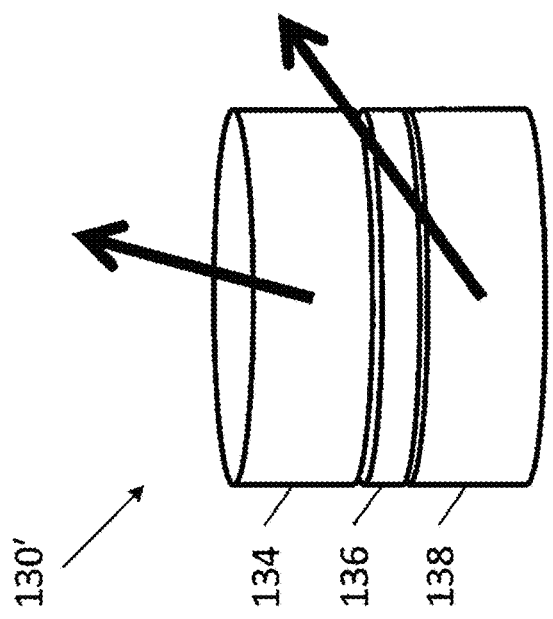
FIG. 5
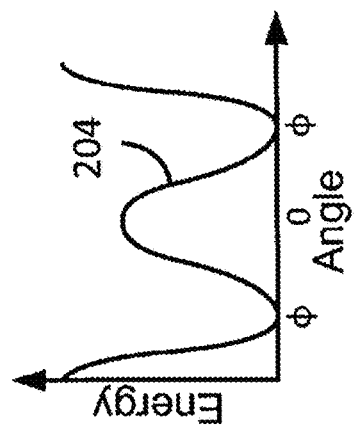
FIG. 6
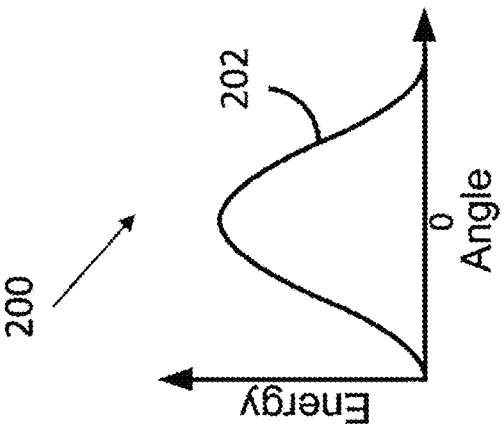

SPIN-TORQUE OSCILLATOR BASED ON EASY-CONE ANISOTROPY

CROSS-REFERENCE TO RELATED APPLICATION(S)

This application claims priority to and the benefit of U.S. Provisional Patent Application No. 62/257,684 filed in the United States Patent and Trademark Office on Nov. 19, 2015, the entire disclosure of which is incorporated herein by reference.

BACKGROUND

Field

Aspects of embodiments of the present invention are directed to devices using spin-torque oscillators or spin-transfer oscillators.

Related Art

Spin-torque oscillators, also known as spin-transfer oscillators or spin-transfer nano-oscillators are magnetic multilayer devices that generally include two conducting magnetic layers: a reference layer (or pinned layer or polarizer layer) having a fixed magnetization, and a free layer (e.g., an isotropic free layer) having a magnetization that is free to rotate (e.g., vortex precession or skyrmion precession) in response to a current generated spin torque.

For example, FIG. 1 depicts a comparative magnetic tunneling junction (MTJ) 1. The comparative MTJ 1 typically resides on a bottom contact 2, and may include a conventional driving reference layer 10, a conventional tunneling barrier layer 20, a conventional free layer 30 (e.g., an isotropic free layer or having an anisotropy parallel to or perpendicular to the x-y plane), a second conventional tunneling barrier layer 40, conventional readout reference layer 50, and a top contact 4.

The bottom and top contacts 2 and 4 are used to drive the current from a current source in a current-perpendicular-to-plane (CPP) direction, or along the z-axis as shown in FIG. 1. The magnetic tunneling junction 1 may also include one or more seed layers (e.g., between the bottom contact and the conventional driving reference layer 10) and may include an antiferromagnetic (AFM) layer. The one or more seed layers may aid in the growth of subsequent layers, such as the AFM layer, having a desired crystal structure. The conventional tunneling barrier layers 20 and 40 are nonmagnetic and may be, for example, a thin insulator such as MgO.

The conventional driving reference layer 10 and the conventional free layer 30 are magnetic. The magnetization 12 of the conventional driving reference layer 10 is fixed, or pinned, in a particular direction, typically by an exchange-bias interaction with the AFM layer. For example, as shown in FIG. 1, the magnetization 12 of the conventional driving reference layer 10 is fixed along the direction perpendicular to the plane (e.g., aligned along the z direction, which is perpendicular to the x-y plane). Although depicted as a simple (single) layer, the conventional driving reference layer 10 may include multiple layers. For example, the conventional driving reference layer 10 may be a synthetic antiferromagnetic (SAF) layer including magnetic layers antiferromagnetically coupled through thin conductive layers, such as Ru. In such an SAF, multiple magnetic layers interleaved with a thin layer of Ru may be used. In another embodiment, the coupling across the Ru layers can be ferromagnetic. Further, other versions of the comparative MTJ 1 might include an additional pinned layer (not shown) separated from the conventional free layer 30 by an additional nonmagnetic barrier or conductive layer (not shown).

The conventional free layer 30 has a changeable magnetization or magnetic moment 32. Although depicted as a simple layer, the conventional free layer 30 may also include multiple layers. For example, the conventional free layer 30 may be a synthetic layer including magnetic layers antiferromagnetically or ferromagnetically coupled through thin conductive layers, such as Ru.

The conventional readout reference layer 50 has a fixed magnetization 52. The fixed magnetization 52 is in a direction such that the angle between its direction and the direction of the changeable magnetization 32 of the conventional free layer 30 varies as the changeable magnetization 32 rotates or precesses. As such, the resistance between the bottom contact 2 and the top contact 4 varies over time in accordance with the inner product of the changeable magnetization 32 of the conventional free layer 30 and the fixed magnetization 52 of the conventional readout reference layer 50.

In general, spin-torque oscillators are of interest due to their small size, easy fabrication using standard silicon processing, radiation hardness, and the frequency of oscillation can be set based on current and the strength of an externally-applied magnetic field.

However, comparative spin-torque oscillators such as that described above present a number of challenges, including requirements for the externally-applied magnetic field to be large (e.g., on the order of 1,000-10,000 Oe), and it may be difficult to modulate the frequency because doing so requires changing the externally-applied magnetic field. In addition, the output power is generally very low (e.g., on the order of 1-10 nW) and comparative oscillators have high current requirements (e.g., on the order of a few mA).

The above information disclosed in this Background section is only for enhancement of understanding of the background of the invention and therefore it may contain information that does not constitute prior art.

SUMMARY

Aspects of embodiments of the present invention are directed to a spin-torque oscillator having a free layer that exhibits easy-cone anisotropy. Embodiments of the present invention provide a spin-torque oscillator having higher output power, smaller externally-applied magnetic field requirements, and easier control (e.g., modulation) of oscillation frequency.

According to one embodiment of the present invention, a spin-torque oscillator includes: a driving reference layer having a fixed magnetization; a nonmagnetic spacer layer; and a free layer having a changeable magnetization exhibiting an easy-cone magnetic anisotropy, the nonmagnetic spacer layer being between the driving reference layer and the free layer, a magnetic anisotropy energy of the free layer having a local maximum along an axis, a local minimum at an angle from the axis, and a global maximum different from the local maximum, the angle being greater than zero degrees, wherein the spin-torque oscillator is configured such that the changeable magnetization of the free layer precesses around the axis.

The spin-torque oscillator may be configured such that a frequency of precession of the changeable magnetization is directly proportional to a magnitude of a current flowing through the spin-torque oscillator.

The frequency of precession may be in a range of 1 MHz to 50 GHz.

An angle of precession of the changeable magnetization may be proportional to the magnitude of the current.

The spin-torque oscillator may further include: a readout layer having a fixed magnetization; and, a second nonmagnetic spacer layer between the readout layer and the free layer, wherein a component of the fixed magnetization of the readout layer extends along a direction perpendicular to the axis, the free layer being between the readout layer and the driving reference layer.

The spin-torque oscillator may further include: a bottom contact; and a top contact, wherein the driving reference layer, the nonmagnetic spacer layer, the free layer, the second nonmagnetic spacer layer, and the readout layer are between the bottom contact and the top contact.

The spin-torque oscillator may further include a current source configured to supply current through the spin-torque oscillator, wherein a resistance between the bottom contact and the top contact varies in accordance with the current supplied to the spin-torque oscillator.

The resistance between the bottom contact and the top contact may vary substantially linearly with respect to the current.

The spin-torque oscillator may further include a compensation reference layer between the top contact and the readout layer, the compensation reference layer having a fixed magnetization in a direction opposite to the fixed magnetization of the readout layer.

The spin-torque oscillator may further include an antiferromagnetic layer on the compensation reference layer.

An externally applied magnetic field may not be required for the changeable magnetization to precess around the axis.

The nonmagnetic spacer layer may include at least one material selected from the group consisting of MgO, AlO, and TiO.

The free layer may include at least one material selected from the group consisting of Fe, Ni, and Co.

The free layer may further include at least one material selected from the group W, Mg, B, Ta, Cs, Zr, Pt, Pd, Tb, and/or Ru.

The free layer may include CoFeNiX, where X is at least one material selected from the group Re, Ir, Bi, and W.

The free layer may include CoFeNiX, where X is at least one material selected from the group I, Te, Os, Pt, and Pb.

An energy density of the easy-cone magnetic anisotropy may be:

$$E(\theta) = K_1 \sin^2(\theta) + \beta K_1 \sin^2(2\theta)$$

where $|\beta|$ is greater than or equal to 0.25.

According to one embodiment of the present invention, an electronic device includes: a spin-torque oscillator including: a driving reference layer having a fixed magnetization; a nonmagnetic spacer layer; and a free layer having a changeable magnetization exhibiting an easy-cone magnetic anisotropy, the nonmagnetic spacer layer being between the driving reference layer and the free layer, a magnetic anisotropy energy of the free layer having a local maximum along an axis, a local minimum at an angle from the axis, and a global maximum different from the local maximum, the angle being greater than zero degrees, wherein the spin-torque oscillator is configured such that the changeable magnetization of the free layer precesses around the axis; a current source configured to supply a current to the spin-torque oscillator; and a read-out circuit configured to measure a resistance of the spin-torque oscillator.

A frequency of precession of the changeable magnetization may be directly proportional to a magnitude of the current.

According to one embodiment of the present invention, a method of manufacturing a spin-torque oscillator includes: providing a driving reference layer; providing a nonmagnetic spacer layer on the driving reference layer; and providing a free layer having easy cone anisotropy on the nonmagnetic spacer layer.

BRIEF DESCRIPTION OF THE DRAWINGS

FIG. 5 depicts a free layer having an easy-cone anisotropy according to one embodiment of the present invention.

FIG. 6 illustrates the total energy versus angle for various magnetic exchange interaction constants $J_{ex}$ in combination with parameters $K_1$ of the materials of the magnetic layers of an free layer having easy-cone anisotropy.

DETAILED DESCRIPTION

Figure 1:
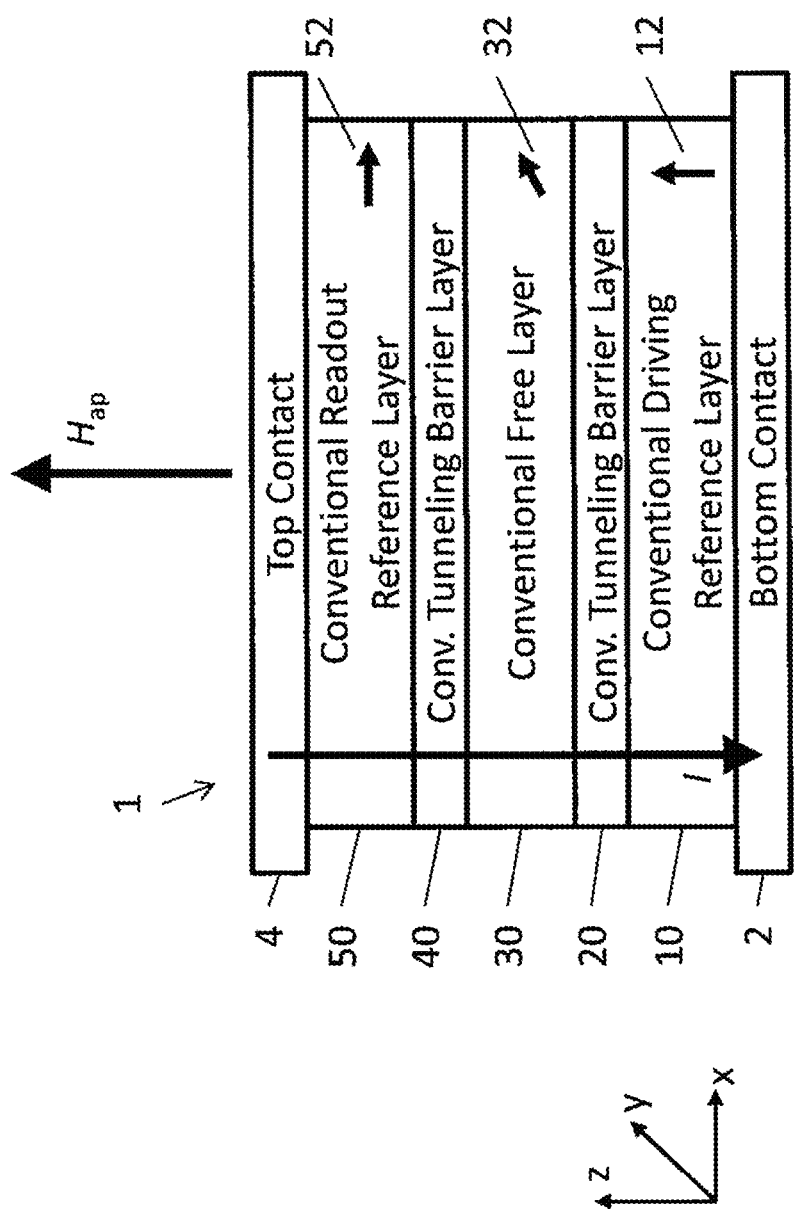
FIG. 1 depicts a comparative magnetic tunneling junction (MTJ).

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Methods and systems for providing a magnetic junction as well as a spin-torque oscillator utilizing the magnetic junction are described. The exemplary embodiments provide methods and systems for providing a magnetic junction usable in a magnetic device. The magnetic junction includes a driving reference layer, a nonmagnetic spacer layer, and a free layer. The nonmagnetic spacer layer is between the driving reference layer and the free layer. The free layer has an easy-cone magnetic anisotropy.

The exemplary embodiments are described in the context of particular magnetic junctions and spin-torque oscillators having certain components. One of ordinary skill in the art will readily recognize that the present invention is consistent with the use of magnetic junctions and spin-torque oscillators having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of spin-torque oscillators having multiple magnetic junctions and using multiple substructures (e.g. an array of spin-torque oscillators arranged in parallel to increase their combined output power). Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Referring back to FIG. 1, when current (I) is applied, by a current source, to the magnetic tunneling junction 1 through the bottom contact 2 and the top contact 4 in the presence of an externally applied magnetic field ($H_{ap}$) (e.g., applied along the z direction), the conventional driving reference layer 10 polarizes the current I (e.g., filters the electrons of the applied current so that most of the electrons exiting the conventional driving reference layer 10 have their spins aligned with the fixed magnetization 12 of the conventional driving reference layer 10). When the polarized charges reach the conventional free layer 30, the spin-polarized electrons apply a torque to the free layer magnetic moment 32, thereby changing the direction of the free layer magnetic moment 32 and causing it to precess about the z axis, where the free layer magnetic moment 32 may have a direction that is tilted at an angle from the z axis. The motion of the free layer magnetic moment 32 as it precesses due to the applied torque depends, in part, upon the strength of the externally applied magnetic field $H_{ap}$ and the magnitude of the current I. Furthermore, the angle between the magnetic moment of the free layer and the externally applied magnetic field $H_{ap}$ varies based on the magnitude of the current I. When the current is zero, the free layer magnetic moment is pushed to or maintained in (e.g., by the externally applied magnetic field $H_{ap}$) a static state where the angle is 0° and the angle may be very small when the current is small. As the current increases, the angle increases and, at very large currents, the free layer magnetic moment may be pushed into an unstable static state (e.g., where the angle is 180°). Because the magnitude of the output signal (e.g., the change in the resistance of the magnetic tunneling junction 1) changes based on the inner product of the direction of the free layer magnetic moment 32 and the readout reference layer magnetic moment, when the above described angle is small, the inner product is small, thereby resulting in a small (e.g., low power) output signal.

Figure 2:
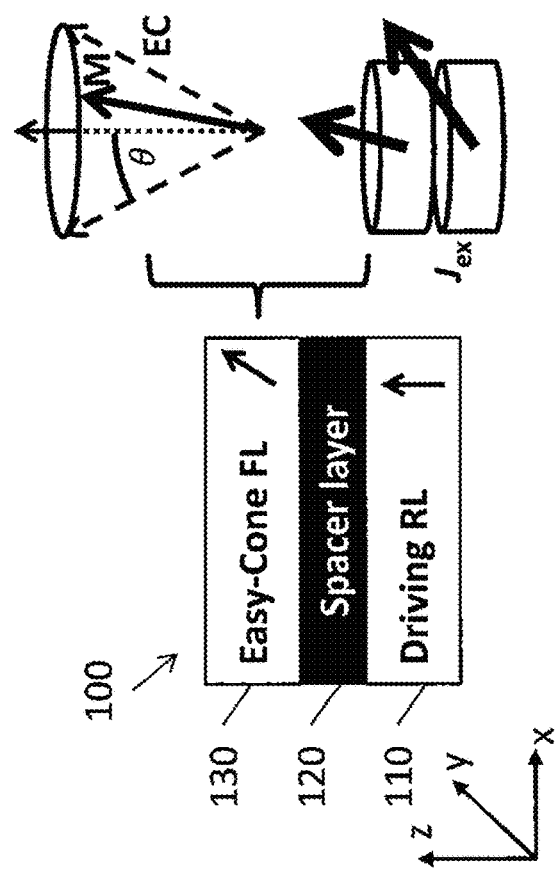
FIG. 2 depicts one embodiment of a magnetic junction used in a magnetic device such as a spin-torque oscillator having an easy-cone free layer according to one embodiment of the present invention.

FIG. 2 depicts one embodiment of a magnetic junction 100 used in a magnetic device such as a spin-torque oscillator having an easy-cone free layer according to one embodiment of the present invention. For clarity, FIG. 2 is not to scale. The magnetic junction 100 includes a driving reference layer (RL) 110, a nonmagnetic spacer layer 120, and a free layer (FL) 130 having easy-cone anisotropy (or easy-cone free layer). The driving reference layer 110 may also be referred to as a pinned layer. In some embodiments, the magnetic junction also includes an optional pinning layer (e.g., contacting the driving reference layer 110), which may be used to fix the magnetization of the driving reference layer 110. In some embodiments, the optional pinning layer may be an antiferromagnetic layer (AFM) layer or multilayer that pins the magnetization of the driving reference layer 110 by an exchange-bias interaction. However, in other embodiments, the optional pinning layer 104 may be omitted or another structure may be used. Further, the magnetic junction 100 may include other and/or additional layers such as optional seed layer(s), optional capping layer(s), and/or top and bottom contact layers.

The driving reference layer 110 is magnetic and thus may include one or more of Ni, Fe, and Co, or alloys thereof. Although depicted as a simple layer, the driving reference layer 110 may include multiple layers. For example, the driving reference layer 110 may be a synthetic antiferromagnet (SAF) including magnetic layers antiferromagnetically or ferromagnetically coupled through thin layers, such as Ru. In such an SAF, multiple magnetic layers interleaved with thin layer(s) of Ru or other material may be used. The driving reference layer 110 may also be another multilayer. The free layer may have a perpendicular anisotropy energy that exceeds the out-of-plane demagnetization energy. In the embodiment shown, the axis of symmetry of the easy-cone is substantially normal to the plane of the free layer 130. In another embodiment, the perpendicular anisotropy in the free layer may be less than the out-of-plane demagnetization energy. In such a case, the axis of symmetry of the easy-cone is substantially in the plane of the free layer.

In some embodiments, the nonmagnetic spacer layer 120 is an insulator, for example a tunneling barrier. In such embodiments, the nonmagnetic spacer layer 120 may include crystalline MgO, which may enhance the tunneling magnetoresistance (TMR) of the magnetic junction. In other embodiments, the nonmagnetic spacer layer 120 may include other oxides such as AlO or TiO. In other embodiments, the nonmagnetic spacer layer may be a conductor, such as Cu. In alternate embodiments, the nonmagnetic spacer layer 120 might have another structure, for example a granular layer including conductive channels in an insulating matrix.

The free layer 130 is magnetic and thus may include at least one of Fe, Ni, and/or Co. The free layer 130 is depicted as a single layer. In other embodiments, described in more detail below, the free layer 130 may include other layer(s). In addition, the free layer 130 has an easy-cone magnetic anisotropy. An easy-cone anisotropy is shown by the magnetization M, in FIG. 2. Because of the easy-cone anisotropy, the total magnetization of the free layer 130 has stable states at an angle θ from the direction perpendicular to the plane of the layers of the magnetic junction 100 (the z-axis in FIG. 2). The angle is less than ninety degrees from the z-axis. Thus, a component of the free layer magnetization is parallel to the plane (e.g., there is a component in the x-y plane) and another component is perpendicular to the plane (e.g., in the z axis). In the embodiment shown in FIG. 2, the symmetry axis of the easy-cone is along the z direction. However, in other embodiments, the symmetry axis of the easy-cone may be in another direction, for example along the in-plane x or y directions.

Figure 3:
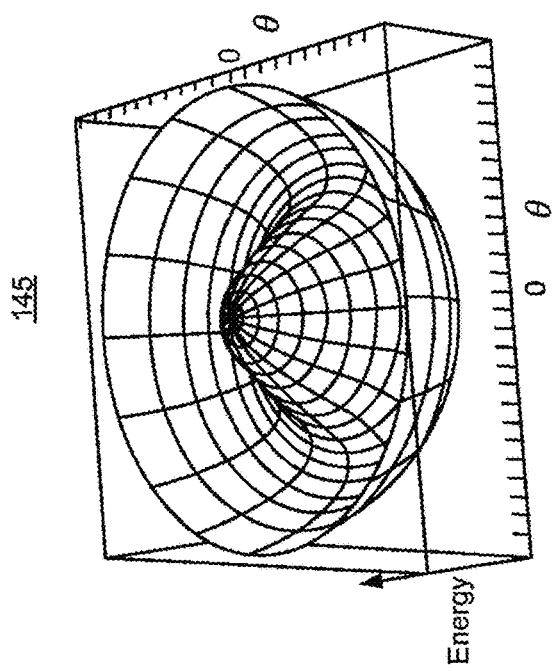
FIG. 3 depicts the magnetic anisotropy energy density for a free layer having easy-cone anisotropy according to one embodiment of the present invention.

FIG. 3 is a rotational plot depicting the magnetic anisotropy energy density for a free layer having easy-cone anisotropy according to one embodiment of the present invention, where the distance from any point in the plane to the origin is θ. Referring to FIGS. 2 and 3, for an easy-cone anisotropy, the magnetic anisotropy energy density 145 has a local maximum at or near the normal to the plane of the magnetic junction 100. In the embodiment shown, the local maximum is at or near zero degrees from the z-axis. In some embodiments, the local maximum is at least ten times $k_bT$, where $k_b$ is Boltzmann's constant and T is the operating temperature of the magnetic junction. In other embodiments, the local maximum is at least twenty times $k_bT$. In addition, the magnetic anisotropy energy density 145 has a local minimum at some angle from the local maximum. The magnetic anisotropy energy density 145 also has a global maximum that is different from the local maximum (e.g., the global maximum is in a location other than at an angle of 0 degrees). The magnetization of the free layer 130 is stable along the local minimum and corresponds to the angle θ labeled in FIG. 2. Thus, as can be seen by the magnetization M in FIG. 3 and the magnetic anisotropy energy density 145, the free layer magnetization is stable at some angle θ around the z-axis. These stable states form a cone around the normal to the plane of the layers of the magnetic junction 100. Hence, as seen in FIG. 2, the free layer 130 magnetic anisotropy is termed an easy-cone anisotropy, where the stable states of the magnetization M lie along an easy-cone EC.

Other properties of the magnetic junction 100 may also be enhanced. The thermal stability and symmetry of the magnetic junction 100 may not be adversely affected. The magnitude of the local maximum in the magnetic anisotropy energy density 145 at 0 degrees from the z-axis may be twenty times $k_bT$ or more. In some embodiments, the local maximum is at least sixty times $k_bT$. In addition to the local maximum at 0 degrees, there is a global maximum, separating the two ground states of the system. This global maximum is located at around 90 degrees from the easy axis. This global maximum is at least 60 or 80 $k_BT$. A global maximum of this magnitude may be sufficient to ensure thermal stability of the magnetic junction 100.

The easy-cone anisotropy for the free layer may be achieved in a number of ways. In one embodiment of the present invention, the easy-cone anisotropy of the free layer is achieved through magnetocrystalline anisotropy. The magnetic anisotropy energy density E of the free layer as a function of the angle θ from the perpendicular axis may be described by:

$$E(\theta)=K_1 \sin^2(\theta)+K_2 \sin^4(\theta) \quad (1)$$

where $K_1$ and $K_2$ are parameters that depend on characteristics of the materials used to form the free layer and where:

$$-2K_2<K_1<0 \quad (2)$$

In some embodiments of the present invention the free layer 130 having easy-cone anisotropy may include materials that have a large corresponding $K_2$ parameter. For example, in some embodiments, Cobalt-Iron-Nickel compounds (CoFeNiX) are used as the material for the free layer 130 having easy-cone anisotropy, where X is one of Re, Ir, Bi, and W. In other embodiments of the present invention, other Cobalt-Iron-Nickel compounds (CoFeNiX) may be used as the material for the free layer 130 having easy-cone anisotropy, where X is one of I, Te, Os, Pt, and Pb. As the term is used herein, Iron-Cobalt-Nickel compounds (CoFeNiX) refer to compounds that include Iron, Cobalt, Nickel, and another element (X). In some embodiments of the present invention, the compound is $Co_aFe_bNi_cX_d$ where a+b+c+d=1 and where 0.4≤b≤0.9. In some embodiments of the present invention, the compound is $Co_aFe_bNi_cX_d$ where a+b+c+d=1 and where 0.5≤b≤0.7.

Alternatively, the magnetic anisotropy energy density E of the easy-cone anisotropy as a function of θ may be described by a fully-equivalent expression:

$$E(\theta)=K_1 \sin^2(\theta)+\beta K_1 \sin^2(2\theta) \quad (3)$$

Figure 4:
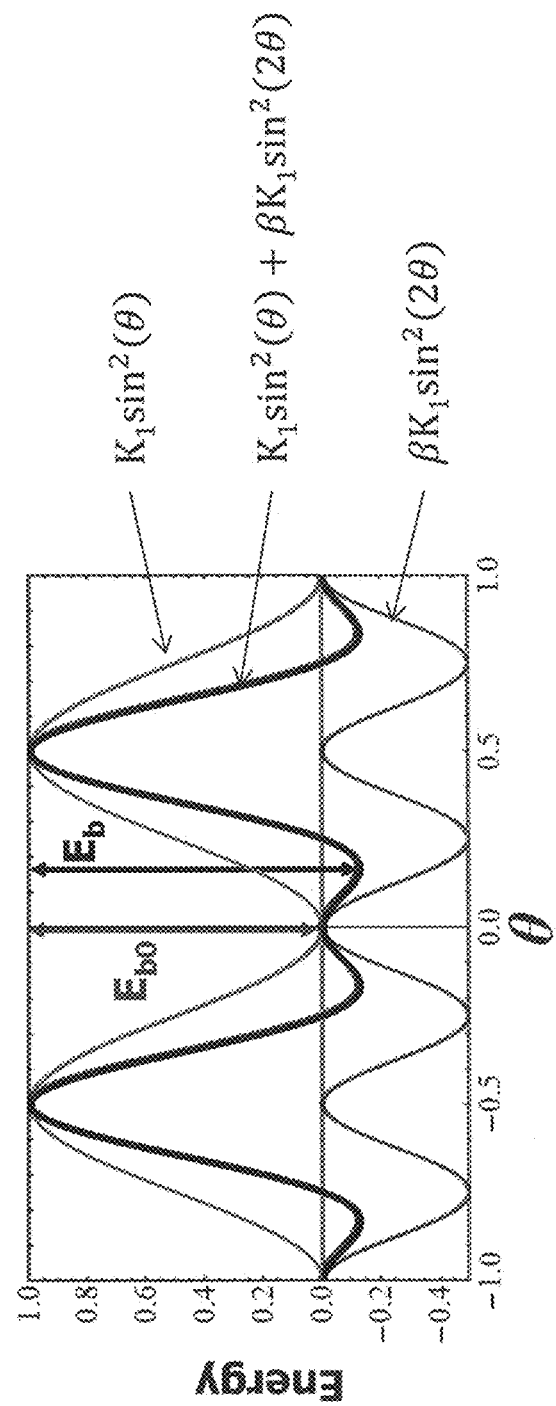
FIG. 4 is a graph illustrating the separate components of an equation describing the magnetic anisotropy energy density of a magnetically anisotropic material.

FIG. 4 is a graph illustrating the separate components of an equation describing the magnetic anisotropy energy density of a magnetically anisotropic material. In particular, FIG. 4 illustrates the separate components ($K_1 \sin^2(\theta)$ and $\beta K_1 \sin^2(2\theta)$) of equation (3) and their sum ($K_1 \sin^2(\theta)+\beta K_1 \sin^2(2\theta)$).

In another embodiment of the present invention, the easy-cone anisotropy of the free layer can be achieved through exchange anisotropy, which arises from the interaction of two ferromagnetic materials that are coupled as in-plane or perpendicular bilayers.

FIG. 5 depicts an embodiment of a free layer 130' having an easy-cone anisotropy. For clarity, FIG. 5 is not to scale. The free layer 130' includes multiple layers. In particular, magnetic layers 134 and 138 separated by interaction control layer 136 (or nonmagnetic exchange interaction control layer) are shown. In the embodiment shown, one magnetic layer 138 has a negative perpendicular anisotropy, $H_k$. Thus, by itself, the magnetization of this layer would stay in the plane of the film. In some embodiments, the layer 138 may include the effect of partial perpendicular anisotropy. This effect reduces the field required to saturate the magnetization of this layer along the z direction. In some embodiments, the partial perpendicular anisotropy is at least twenty percent of $4\pi M_s$ and less than ninety percent of $4\pi M_s$. The other magnetic layer 134 has a high perpendicular anisotropy $H_k$. In some embodiments, the magnitude of the high perpendicular anisotropy depends upon the size of the magnetic junction. For example, for a larger magnetic junction 100', having a diameter on the order of one hundred nanometers, the large $H_k$ may be greater than one thousand Oersted (1 kOe). In contrast, for a smaller magnetic junction 100' having a diameter on the order of ten nanometers, $H_k$ can be greater than five thousand Oersted (5 kOe). The layers 134 and 138 are ferromagnetic and thus include one or more of Fe, Co, and Ni. Other materials including but not limited to W, Mg, C, B, Ta, Cs, Zr, Pt, Pd, Tb, and/or Ru may also be included in the layers 134 and 138. Note that the same or different materials may be used for the layers 134 and 138. The combination of the material(s) used and/or the thicknesses of the layers 134 and 138, as well as the interaction control layer 136, may be tailored such that the desired anisotropies are produced in the layers 134 and 138.

The free layer 130' in this embodiment also includes interaction control layer 136. The interaction control layer may be used to manage magnetic interactions, such as exchange interactions, between the magnetic layers 134 and 138. The interaction control layer 136 is nonmagnetic or weakly magnetic. For example, Fe, Co, Ni, Ta, Cr, Mg, MgO, Ti, W, Ir, Rh, and/or Ru or an alloy of these materials might be used for the interaction control layer 136. The thickness of the interaction control layer 136 may also vary. In some embodiments, the interaction control layer 136 is at least 0.1 nm and not more than 1.5 nm. For example, if Ru is used, the interaction control layer 136 may be at least 0.3 nm and not greater than 1.3 nm. If Ta is used, then the interaction control layer 136 may be at least 0.1 nm and not more than 1.0 nm.

The effect of the interaction control layer 136 may be seen with reference to FIG. 6, which depicts the total energy versus angle for various magnetic exchange interaction constants $J_{ex}$ in combination with parameters $K_1$ of the materials of the magnetic layers 134 and 138. For simplicity, the curves 200 in FIG. 6 are depicted in two dimensions as the magnetic junction 100' may (but need not be) symmetric around the z-axis. Referring to FIGS. 5 and 6, the curve 202 depicts the magnetic anisotropy energy density versus angle for a very low exchange coupling $J_{ex}$ between the layers 134 and 138. The curve 204 depicts the magnetic anisotropy energy density versus angle for an intermediate exchange coupling $J_{ex}$ between the layers 134 and 138. In the embodiment shown, the exchange coupling $J_{ex}$ is on the order of $1.5\times10^{-4}$ J/m². In general, the exchange coupling $J_{ex}$ is on the order of $0.5\times10^{-4}$ J/m²–$20\times10^{-4}$ J/m². The curve 206 depicts the magnetic anisotropy energy density versus angle for a high exchange coupling $J_{ex}$ between the layers 134 and 138. As can be seen in the curves 202 and 206, for low and high exchange couplings, there is no local maximum surrounded by the local minimum (labeled in FIG. 6 as $\phi$) for the easy-cone anisotropy. However, for an intermediate exchange coupling, the magnetic anisotropy energy density has a local maximum near zero degrees from the normal to the surface, thereby resulting in the easy-cone anisotropy of the free layer 130'.

Figure 7:
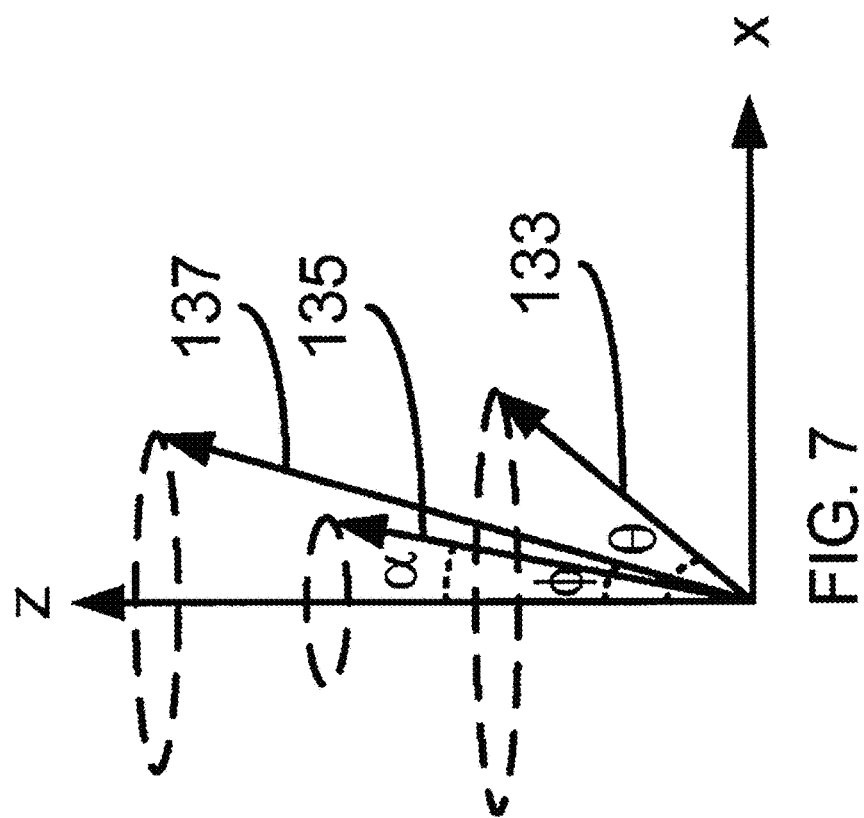
FIG. 7 illustrates the magnetization of a free layer having easy-cone anisotropy due to exchange interactions according to one embodiment of the present invention.

The magnetization of the free layer 130' may be seen with reference to FIG. 7, which depicts one embodiment of the magnetization for the free layer 130' having an easy-cone anisotropy. Referring to FIGS. 5, 6, and 7, the negative perpendicular anisotropy layer 134 has a magnetization 133. If there were no interactions between the magnetic layers 134 and 138, the magnetization 133 would lie in plane. However, because of the exchange interaction between the layers 134 and 138, the magnetization 133 is at an angle 9 from the z-axis (normal to the plane of the magnetic junction 100'). The high perpendicular anisotropy layer 138 has a magnetization 135. This magnetization 135 may lie along the z-axis in the absence of the layer 134 having negative perpendicular anisotropy. However, because of the exchange interaction, the magnetization 135 is at an angle α from the z-axis. The total magnetization of the free layer 130' is given by magnetization 137, which lies at an angle $\phi$ from the z-axis. This angle corresponds to the local minima in the curve 204.

The effect of the easy-cone anisotropy may be understood mathematically. The magnetic anisotropy energy per unit area of the free layer 130' may be given as a function of angle from a particular direction by:

$$E(\theta,\alpha) = -H_{K,134}*M_{134}*t_{134}*\cos^2(\theta) - H_{K,138}*M_{138}*t_{138}*\cos^2(\alpha) + \sigma\cos(\theta-\alpha)$$

where $H_{K,134}$ is the effective perpendicular anisotropy field for layer 134; $M_{134}$ is the magnetization of the layer 134; $t_{134}$ is the thickness of the layer 134; $H_{K,138}$ is the effective perpendicular anisotropy field for layer 138; $M_{138}$ is the saturation magnetization of the layer 138, $t_{138}$ is the thickness of the layer 138, and σ is areal exchange energy density. The net result is that the magnetization 137 of the free layer is stable in an angle $\phi$ from the z-axis, as shown in FIG. 7. The free layer 130' thus exhibits easy-cone anisotropy.

A spin-torque oscillator having a free layer 130 that exhibits easy-cone anisotropy has improved precession characteristics of the device when compared to comparative spin-torque oscillators having free layers that do not exhibit easy-cone anisotropy. In particular, the easy-cone anisotropy of the free layer enables spin-torque oscillators according to embodiments of the present invention to operate with low input power (e.g., significantly lower than a few mA) and without the need for an external magnetic field, because the easy-cone anisotropy enables the stable precession of the field. In addition, spin-torque oscillators according to embodiments of the present invention have high output power and the frequency of oscillation can be controlled over a wide range by controlling the current (e.g., by controlling the current source).

A magnetic junction 100 according to one embodiment of the present invention, the frequency of precession f as a function of θ is given by:

$$f(\theta) = f_0\cos(\theta)[1 - 4\beta + 8\beta\cos^2(\theta)] = \frac{\eta\hbar}{4e\alpha}J_c \quad (4)$$

where $f_0$ is the frequency of the oscillator without any higher-order anisotropy (β=0), β is the parameter from equation (3), η is STT efficiency, related to polarization of the MTJ, ℏ is Plank's constant, e is the charge of an electron, α is magnetic damping, and $J_c$ is the magnitude of the current applied through the magnetic junction 100.

Rearranging the above to solve for $J_c$:

$$J_c = \frac{4e\alpha}{\eta\hbar} E_b \cos(\theta)[1 - 4\beta + 8\beta\cos^2(\theta)] \quad (5)$$

where A is cross-sectional area of the MTJ and $E_b$ is the thermal stability factor.

Figure 8:
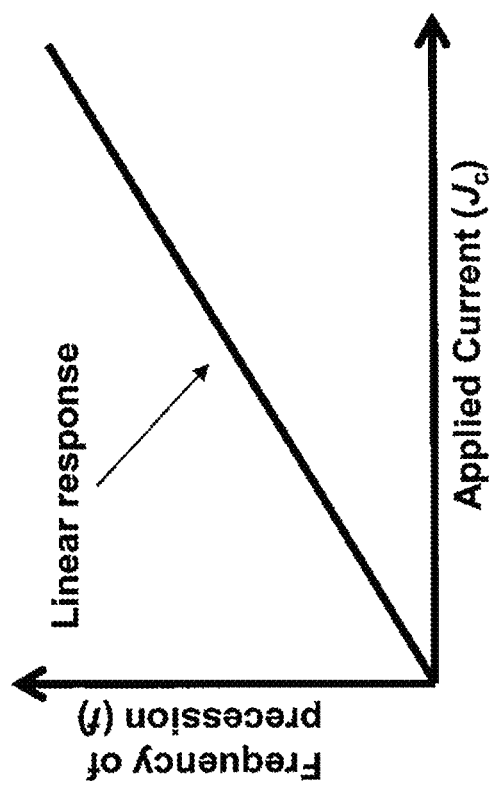
FIG. 8 illustrates the relationship between current and frequency of precession of a spin-torque oscillator according to one embodiment of the present invention.

As seen from equations (4) and (5) above, the frequency of precession f is linearly proportional to (e.g., directly proportional to) the applied current $J_c$, as shown in FIG. 8. The operating frequency range of a spin-torque oscillator according to embodiments of the present invention is limited by the anisotropy $H_k$ of the material and, in various embodiments, may vary in the range from megahertz (MHz) (e.g., 1 MHz) to about 10 gigahertz (GHz). In certain embodiments with higher K1, K2 values, the frequency can extend beyond 10 GHz and be up to 50 GHz.

Figure 9:
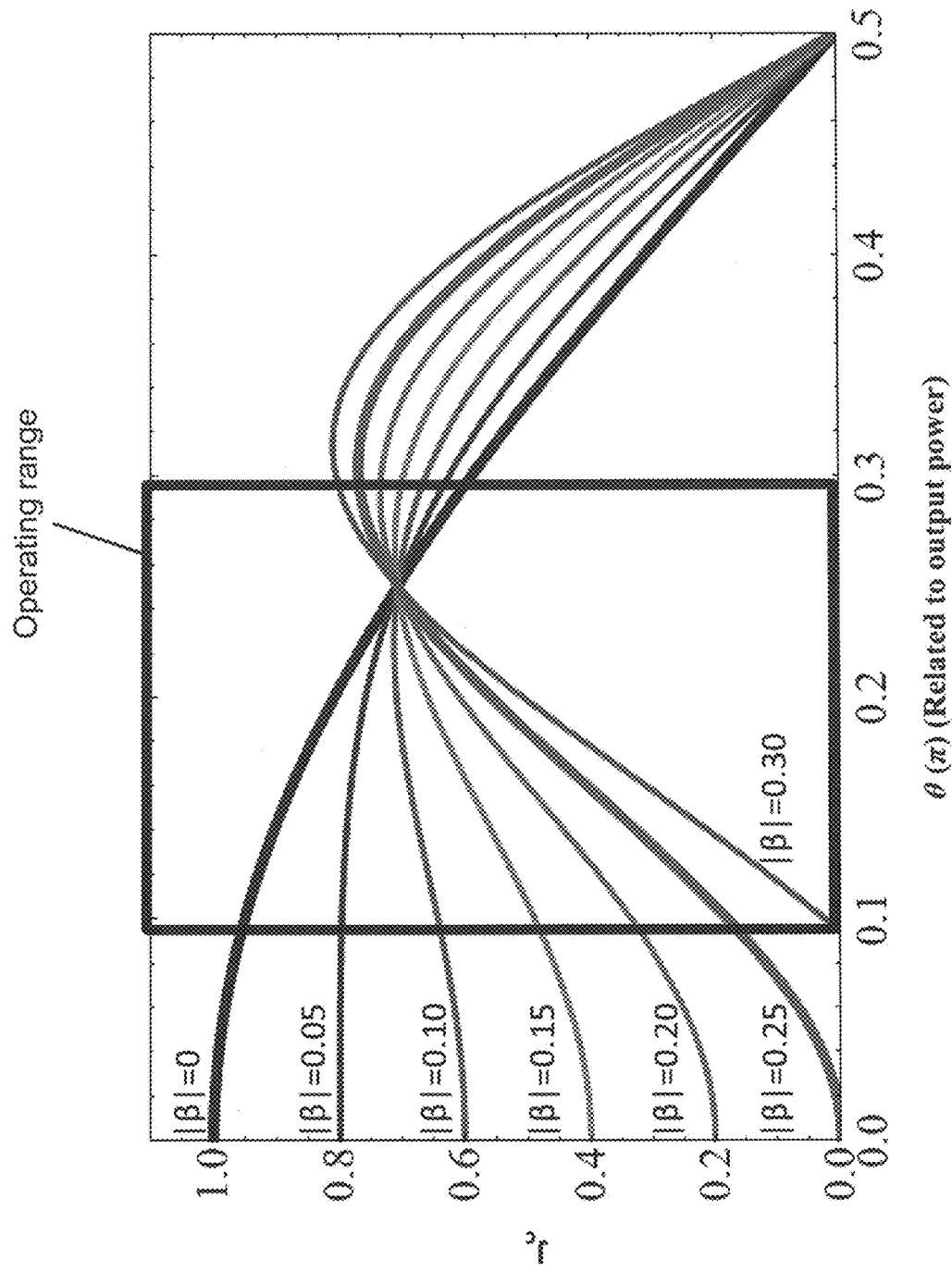
FIG. 9 is a graph illustrating an angle of an easy-cone of an easy-cone anisotropic free layer according to one embodiment of the present invention at various current levels and for different values of parameter fl.

FIG. 9 is a graph illustrating an angle θ of the easy-cone at different current levels for different values of β (referring back to equations (3), (4), and (5)) (β=0, corresponds to the uniaxial case, in which there is no local minimum surrounding the z axis.) As seen in FIG. 9, in one embodiment, when |β|=0.25 the angle of precession θ increases with increasing current, and when |β| is greater than 0.25 (e.g., |β|=0.30), then the precession immediately starts at a nonzero angle (e.g., 0.1 radians, as shown in FIG. 9), where $\theta_0$ is the angle at which $J_c$, in FIG. 9, is 0.0.

$$\theta_0 = \frac{1}{2}\arccos\left(-\frac{1}{4\beta}\right)$$

In addition, as seen in FIG. 9, when β is greater than about 0.25, the initial amplitude of the oscillations is large (e.g., θ is large), even for relatively small currents $J_c$ and the amplitude increases with current, due to the easy-cone anisotropy of the free layer 130. Therefore, very small currents are sufficient to generate detectable precession, thereby reducing input power requirements. In one embodiment, the current densities are in the range of 1-5 mA/cm². Furthermore, embodiments of the present invention do not require the presence of a large externally magnetic field, thereby further reducing power consumption when used in devices.

The large initial angle of precession also corresponds to an increase in output power of a spin-torque oscillator according to embodiments of the present invention.

Figure 10:
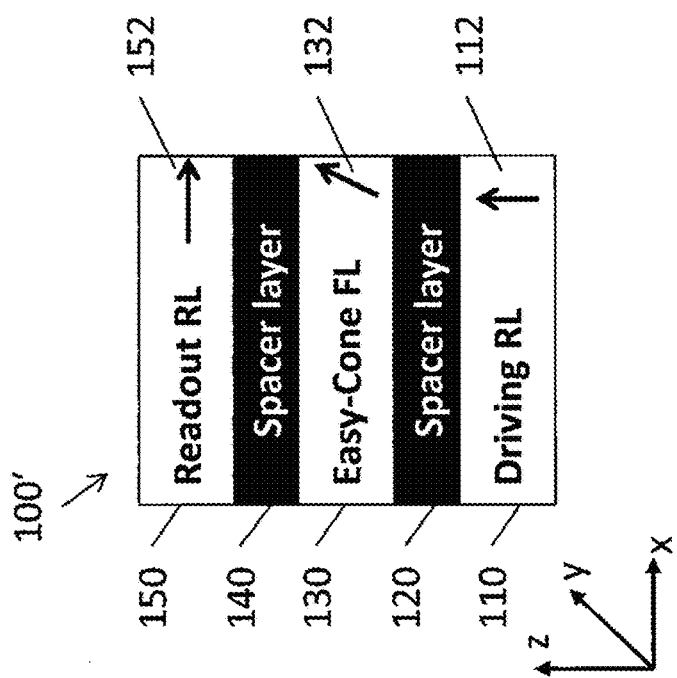
FIG. 10 is a schematic diagram of a spin-torque oscillator according to one embodiment of the present invention, further including a readout reference layer.

FIG. 10 is a schematic diagram of a spin-torque oscillator according to one embodiment of the present invention, further including a readout reference layer. The structure of the magnetic junction 100' shown in FIG. 10 is substantially similar to that of the device shown in FIG. 2. As such, description of substantially similar components will not be repeated herein. The magnetic junction 100' further includes a readout reference layer 150 having a fixed magnetization 152, where a component of the fixed magnetization extends along a direction that is perpendicular to the axis about which the magnetization 132 (or magnetic moment) of the free layer 130 having the easy-cone anisotropy precesses (e.g., the readout reference layer 150 has a magnetization in the direction along the x-y plane, shown in the example embodiment of FIG. 11, in the +x direction). As such, the precession of the magnetization 132 of the free layer 130 can be detected by a read-out circuit measuring the resistance of the magnetic junction 100' (e.g., the resistance is lower when the magnetization 132 of the free layer is aligned with the magnetization 152 of the readout layer and the resistance is higher when they are in opposite directions). The read-out circuit may include a current source configured to supply current to a first end of an inductor, a second end of the inductor being coupled to a node. The node may be coupled to a top contact of the spin-torque oscillator that includes the magnetic junction 100' and the node may also be connected to a first electrode of a capacitor. The bottom contact of the spin-torque oscillator may be connected to ground. The second electrode of the capacitor may be coupled to a first end of a resistive load and the second end of the restive load may be coupled to ground. The combination of the inductor and the capacitor may be referred to as a bias tee. As the resistance of the spin-torque oscillator varies, the power delivered to the load varies, thereby allowing read-out of the oscillations of the spin-torque oscillator. A second nonmagnetic spacer layer 140 (e.g., MgO) may be between the easy-cone free layer and the readout reference layer 150.

Figure 11:
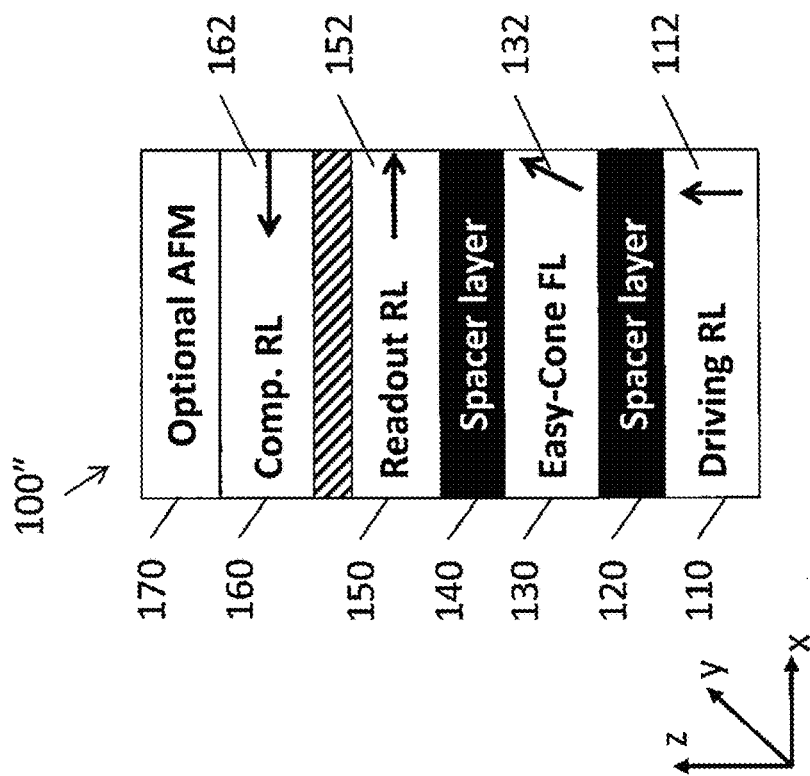
FIG. 11 is a schematic diagram of a spin-torque oscillator according to one embodiment of the present invention, further including a readout reference layer and a compensation reference layer.

FIG. 11 is a schematic diagram of a spin-torque oscillator according to one embodiment of the present invention, further including a compensation reference layer. The magnetic junction 100'' further includes a compensation reference layer 160 having a fixed magnetization 162 in a direction opposite that of the readout reference layer 150 in order to cancel out undesired effects of the magnetization of the readout reference layer 150. For example, as shown in FIG. 11, the readout reference layer 150 has a magnetization 152 pointing in the +x direction and the compensation reference layer 160 has a magnetization 162 pointing in the −x direction. The magnetic junction 100'' may further include an antiferromagnetic layer 170 on the compensation reference layer to pin the magnetization direction of the compensation reference layer 160.

Figure 12:
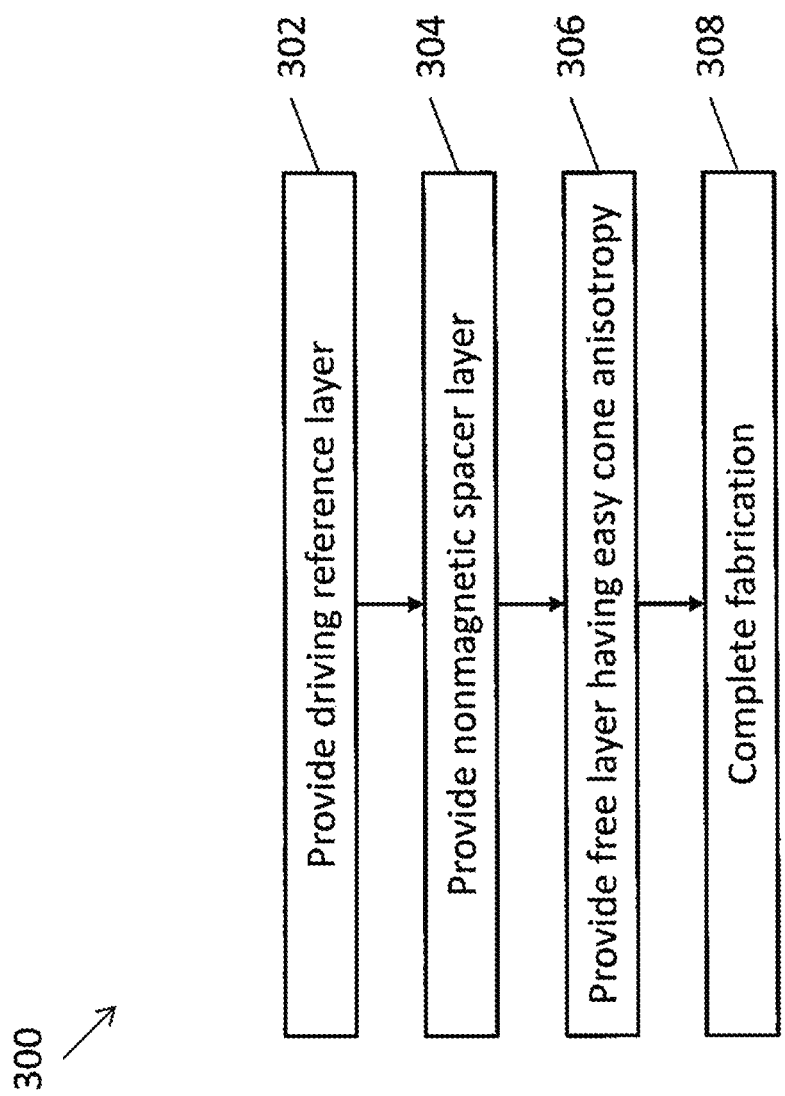
FIG. 12 is a flowchart illustrating a method for manufacturing a spin-torque oscillator according to one embodiment of the present invention.

FIG. 12 is a flowchart illustrating a method for manufacturing a spin-torque oscillator according to one embodiment of the present invention. Some operations may be omitted or combined. The method 300 is described in the context of the magnetic junction 100. However, the method 300 may be used on other magnetic junctions such as the junctions 100' and 100''. Further, the method 300 may be incorporated into fabrication of a spin-torque oscillator. Thus the method 300 may be used in manufacturing a spin-torque oscillator or a larger device (e.g., a processor) that includes a spin-torque oscillator. The method 300 may commence after one or more seed layers and an optional pinning layer are provided.

The driving reference layer 110 is provided, via operation 302. Operation 302 may include depositing the desired materials at the desired thickness of the driving reference layer 110. Further, operation 302 may include providing a synthetic antiferromagnet (SAF). The nonmagnetic spacer layer 120 is provided, via operation 304. Operation 304 may include depositing the desired nonmagnetic materials, including but not limited crystalline MgO. In addition, the desired thickness of material may be deposited in operation 304.

The free layer 130 having the easy cone anisotropy is provided, in operation 306. In some embodiments, operation 306 may be completed by depositing a multilayer, such as the free layer 130', 130'', 200, and/or 200'. Fabrication is then completed, via operation 308. For example, a capping layer may be provided. In other embodiments, the second nonmagnetic spacer layer 140, readout reference layer 150 and additional optional compensation reference layer 160 and option pinning layer 170 may be provided. In some embodiments, in which the layers of the magnetic junction are deposited as a stack, then defined, operation 308 may include defining the magnetic junction 100, performing anneals, or otherwise completing fabrication of the magnetic junction 100. Further, if the magnetic junction 100 is incorporated into a spin-torque oscillator, operation 308 may include providing contacts, bias structures, and other portions of the spin-torque oscillator. Thus, the magnetic junction 100, 100', and/or 100" are formed. Consequently, the benefits of the magnetic junction may be achieved.

As such, aspects of embodiments of the present invention provide a spin-torque oscillator that can operate with low input power and without the use of a large externally applied magnetic field and that provides high output power. As such, embodiments of the present invention provide an improvement over existing spin-torque oscillators, which generally require large externally applied magnetic fields and high driving currents, and which generally have low output power. Embodiments of the present invention may be used in a variety of electronic devices and semiconductor devices that make use of oscillators, such as providing local chip clocks in VLSI and providing oscillators for modulating and demodulating communication signals While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A spin-torque oscillator comprising:
a driving reference layer having a fixed magnetization;
a nonmagnetic spacer layer;
a free layer having a changeable magnetization exhibiting an easy-cone magnetic anisotropy, the nonmagnetic spacer layer being between the driving reference layer and the free layer, a magnetic anisotropy energy of the free layer having a local maximum along an axis, a local minimum at an angle from the axis, and a global maximum different from the local maximum, the angle being greater than zero degrees;
a readout layer having a fixed magnetization; and
a second nonmagnetic spacer layer between the readout layer and the free layer,
wherein the spin-torque oscillator is configured such that the changeable magnetization of the free layer precesses around the axis, and
wherein a component of the fixed magnetization of the readout layer extends along a direction perpendicular to the axis, the free layer being between the readout layer and the driving reference layer.

2. The spin-torque oscillator of claim 1, wherein the spin-torque oscillator is configured such that a frequency of precession of the changeable magnetization is directly proportional to a magnitude of a current flowing through the spin-torque oscillator.

3. The spin-torque oscillator of claim 2, wherein the frequency of precession is in a range of 1 MHz to 50 GHz.

4. The spin-torque oscillator of claim 2, wherein an angle of precession of the changeable magnetization is proportional to the magnitude of the current.

5. The spin-torque oscillator of claim 1, further comprising:
a bottom contact; and
a top contact,
wherein the driving reference layer, the nonmagnetic spacer layer, the free layer, the second nonmagnetic spacer layer, and the readout layer are between the bottom contact and the top contact.

6. The spin-torque oscillator of claim 5, further comprising a current source configured to supply current through the spin-torque oscillator,
wherein a resistance between the bottom contact and the top contact varies in accordance with the current supplied to the spin-torque oscillator.

7. The spin-torque oscillator of claim 6, wherein the resistance between the bottom contact and the top contact varies substantially linearly with respect to the current.

8. The spin-torque oscillator of claim 5, further comprising a compensation reference layer between the top contact and the readout layer, the compensation reference layer having a fixed magnetization in a direction opposite to the fixed magnetization of the readout layer.

9. The spin-torque oscillator of claim 8, further comprising an antiferromagnetic layer on the compensation reference layer.

10. The spin-torque oscillator of claim 1, wherein an externally applied magnetic field is not required for the changeable magnetization to precess around the axis.

11. The spin-torque oscillator of claim 1, wherein the nonmagnetic spacer layer comprises at least one material selected from the group consisting of MgO, AlO, and TiO.

12. The spin-torque oscillator of claim 1, wherein the free layer comprises at least one material selected from the group consisting of Fe, Ni, and Co.

13. The spin-torque oscillator of claim 1, wherein the free layer further comprises at least one material selected from the group consisting of W, Mg, B, Ta, Cs, Zr, Pt, Pd, Tb, and/or Ru.

14. The spin-torque oscillator of claim 1, wherein the free layer comprises CoFeNiX, where X is at least one material selected from the group consisting of Re, Ir, Bi, and W.

15. The spin-torque oscillator of claim 1, wherein the free layer comprises CoFeNiX, where X is at least one material selected from the group consisting of I, Te, Os, Pt, and Pb.

16. The spin-torque oscillator of claim 1, wherein an energy density of the easy-cone magnetic anisotropy is:

$$E(\theta)=K_1 \sin^2(\theta)+\beta K_1 \sin^2(2\theta)$$

where $|\beta|$ is greater than or equal to 0.25.

17. An electronic device comprising:
a spin-torque oscillator comprising:
a driving reference layer having a fixed magnetization;
a nonmagnetic spacer layer;
a free layer having a changeable magnetization exhibiting an easy-cone magnetic anisotropy, the nonmagnetic spacer layer being between the driving reference layer and the free layer, a magnetic anisotropy energy of the free layer having a local maximum along an axis, a local minimum at an angle from the axis, and a global maximum different from the local maximum, the angle being greater than zero degrees;
a readout layer having a fixed magnetization; and
a second nonmagnetic spacer layer between the readout layer and the free layer,
wherein the spin-torque oscillator is configured such that the changeable magnetization of the free layer precesses around the axis, and
wherein a component of the fixed magnetization of the readout layer extends along a direction perpendicular to the axis, the free layer being between the readout layer and the driving reference layer;
a current source configured to supply a current to the spin-torque oscillator; and a read-out circuit configured to measure a resistance of the spin-torque oscillator.

18. The electronic device of claim 17, wherein a frequency of precession of the changeable magnetization is directly proportional to a magnitude of the current.

19. A method of manufacturing a spin-torque oscillator, comprising:

providing a driving reference layer;

providing a nonmagnetic spacer layer on the driving reference layer;

providing a free layer having easy cone anisotropy on the nonmagnetic spacer layer;

providing a second nonmagnetic spacer layer on the free layer; and providing a readout layer having a fixed magnetization on the second nonmagnetic spacer layer, wherein a component of the fixed magnetization of the readout layer extends along a direction perpendicular to an axis, the free layer being between the readout layer and the driving reference layer.

* * * * *